(12) United States Patent
Fujisawa et al.

(10) Patent No.: US 6,187,600 B1
(45) Date of Patent: Feb. 13, 2001

(54) SILICON SUBSTRATE EVALUATION METHOD AND SEMICONDUCTOR DEVICE MANUFACTURING METHOD

(75) Inventors: Yoichi Fujisawa; Kaoru Ogawa; Kenichi Hikazutani, all of Kawasaki (JP)

(73) Assignee: Fujitsu Limited, Kawasaki (JP)

( * ) Notice: Under 35 U.S.C. 154(b), the term of this patent shall be extended for 0 days.

(21) Appl. No.: 09/175,404

(22) Filed: Oct. 20, 1998

(30) Foreign Application Priority Data

Apr. 28, 1998 (JP) .................................................. 10-119254

(51) Int. Cl.[7] ............................. G01R 31/26; H01L 21/66
(52) U.S. Cl. ................................. 438/14; 134/2; 148/33.2
(58) Field of Search .................... 438/14; 134/2; 148/33.2

(56) References Cited

U.S. PATENT DOCUMENTS

| | | | |
|---|---|---|---|
| 3,920,492 | * 11/1975 | Sugita et al. | 148/175 |
| 3,997,368 | * 12/1976 | Petroff et al. | 148/175 |
| 5,176,756 | * 1/1993 | Nakashima et al. | 134/2 |
| 5,508,800 | * 4/1996 | Miyashita et al. | 356/30 |
| 5,656,097 | * 8/1997 | Olesen et al. | 134/1 |
| 5,908,509 | * 6/1999 | Olesen et al. | 134/1.3 |
| 5,946,543 | * 8/1999 | Kimura et al. | 438/14 |

OTHER PUBLICATIONS

P. Wagner, M. Brohl, D. Graf, and U. Lambert, "Surfaces and Crystal Defects of Silicon" in Materials Research Society Symposium Proceedings, vol. 378, Materials Research Society, pp. 17–22, 1995.*

Werner Kern, "The Evolution of Silicon Wafer Cleaning Technology" in J. Electrochem. Soc., vol. 137(6), pp. 1887–1892, Jun. 1990.*

* cited by examiner

Primary Examiner—Charles Bowers
Assistant Examiner—Erik Kielin
(74) Attorney, Agent, or Firm—Armstrong, Westerman, Hattori, McLeland & Naughton

(57) ABSTRACT

A surface layer portion of a silicon substrate is etched by using a mixed solution which contains ammonium hydroxide ($NH_4OH$), hydrogen peroxide ($H_2O_2$) and water ($H_2O$) at a weight ratio of 1:(1.3 to 2.65):(275 to 433). The density of the etch pits which have occurred in a surface of the silicon substrate whose surface layer portion was etched by the etching step is measured. The crystal quality, etc. of the silicon substrate are evaluated before a process for manufacturing semiconductor devices using such silicon substrates, in order to avoid a lowering of the yields of the semiconductor devices.

6 Claims, 5 Drawing Sheets

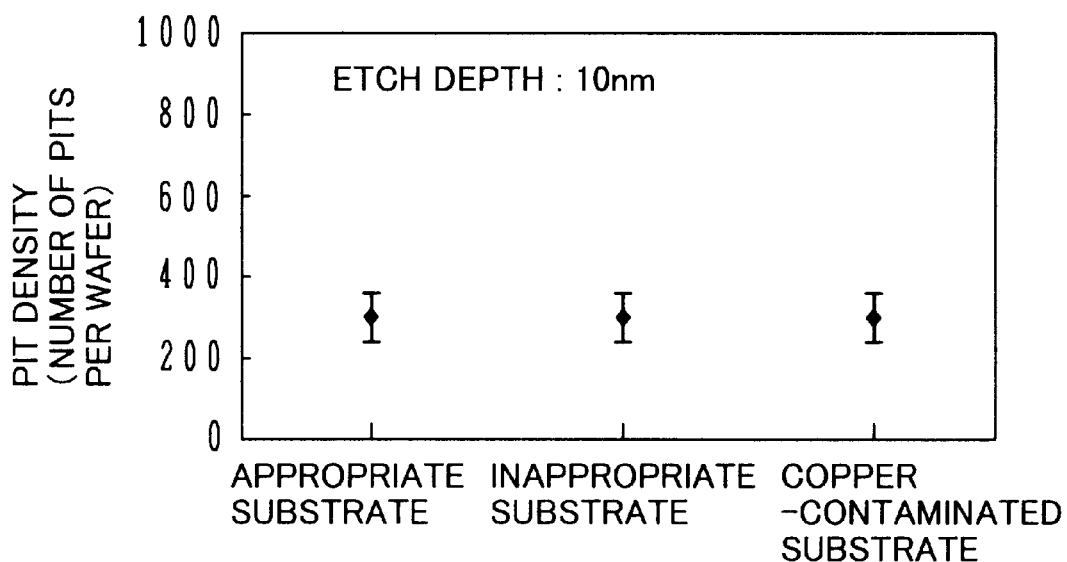
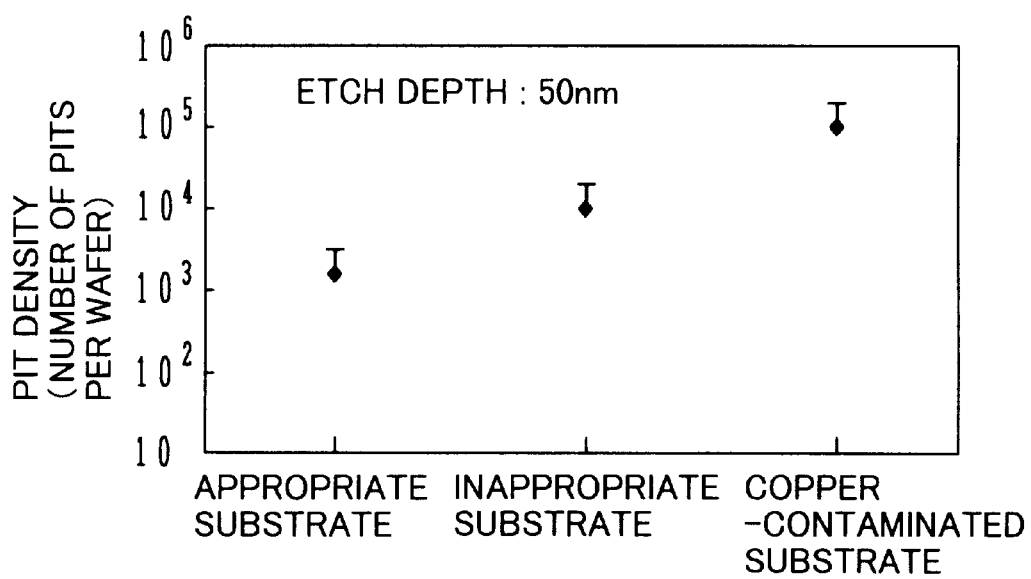

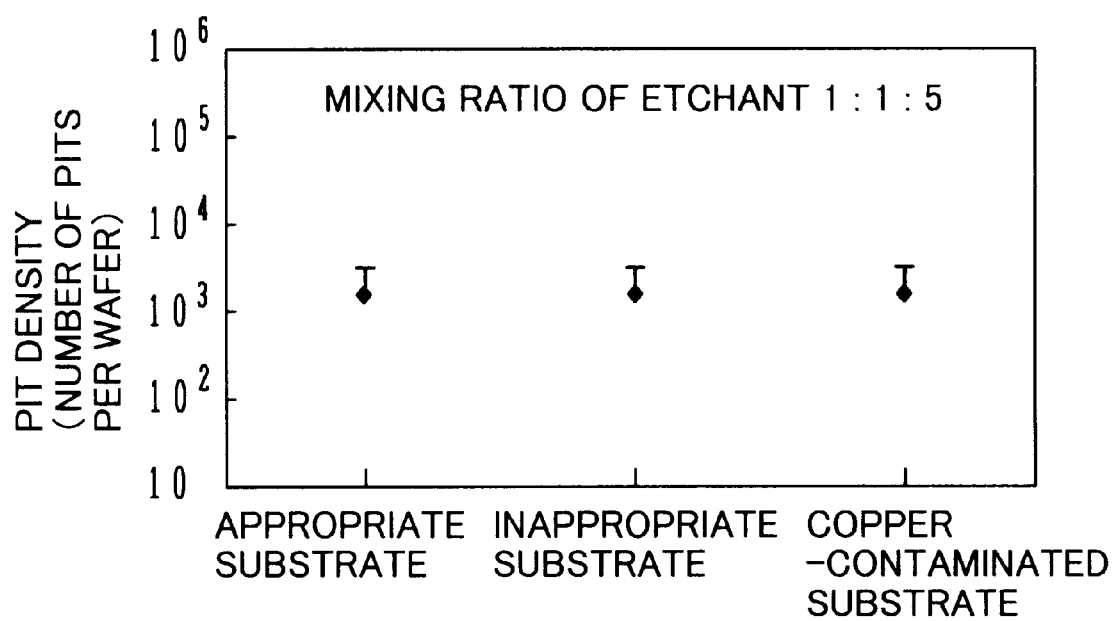

SILICON SUBSTRATE EVALUATION METHOD AND SEMICONDUCTOR DEVICE MANUFACTURING METHOD

This application Is based on Japanese patent application Hei 10-119254 filed on Apr. 28, 1998, the entire contents of which are incorporated herein by reference.

BACKGROUND OF THE INVENTION

1. Field of the Invention

The present invention relates to a silicon substrate evaluation method, and more particularly to a silicon substrate evaluation method which can prevent a lowering of the yield of semiconductor IC devices.

2. Description of the Related Art

With the recent high-density integration and miniaturization of dynamic random access memories (DRAMs), etc., it has been strongly required to reduce a microscopic warp which occurs in the surfaces of silicon substrates while being processed, as well as crystal defects in the silicon substrates and the surface contamination of the silicon substrates. The techniques for evaluating the microscopic warp, the crystal defects and the surface contamination in advance are needed.

According to one known method for evaluating any crystalline imperfection in a silicon substrate surface, an oxide film is removed after an oxidization process, etching is conducted through the use of an acid selective etchant, and thereafter the pits which have occurred in the substrate surface are detected. According to another known method for evaluating the crystalline imperfection, the half width of the rocking curve, obtained by the X-ray diffraction of the surface layer portion of a silicon substrate, is measured.

However, the crystal imperfection cannot be satisfactorily evaluated by the method adopting the acid selective etchant or the method using the rocking curve obtained by the X-ray diffraction. The presence of the crystal imperfection in the silicon substrate surface cannot be detected until any inconvenience occurs during a semiconductor IC manufacturing process.

SUMMARY OF THE INVENTION

It is accordingly an object of the present invention to provide a silicon substrate evaluation method by which the crystal quality, etc. of a silicon substrate is evaluated before a process for manufacturing semiconductor devices using such silicon substrates, in order to avoid a lowering of the yield of the semiconductor devices.

It is another object of the present invention to provide a semiconductor device manufacturing method which utilizes the aforementioned evaluation method in order to avoid a lowering of the yield of the semiconductor devices.

According to one aspect of the present invention, there is provided a method for evaluating a silicon substrate, comprising an etching step of etching a surface layer portion of the silicon substrate with a mixed solution which contains ammonium hydroxide ($NH_4OH$), hydrogen peroxide ($H_2O_2$) and water ($H_2O$) at a weight ratio of 1:(1.3 to 2.65):(275 to 433), and a measurement step of measuring a density of pits which have occurred in a surface of the silicon substrate subjected to the etching step.

When etching is performed using the above-described solution, pits occur in correspondence with any crystal defects, etc. By measuring the density of the pits, therefore, the crystal quality, etc. of the silicon substrate can be evaluated.

According to another aspect of the present invention, there is provided a method for evaluating a silicon substrate, comprising an etching step of etching a surface layer portion of the silicon substrate with a mixed solution which contains ammonia, hydrogen peroxide and water, a first oxidation step of oxidizing a surface of the silicon substrate subjected to the etching step, a heat treatment step of heating the silicon substrate oxidized by the first oxidation step to a temperature higher than an oxidation temperature in the first oxidation step, a second oxidation step of oxidizing the surface of the silicon substrate subjected to the heat treatment step, and a measurement step of measuring a density of pits which have occurred in the surface of the silicon substrate subjected to the second oxidation step.

Conducting the first oxidation step, the heat treatment and the second oxidation step results in the detection of the pits being facilitated so as to permit the crystal quality, etc. of the silicon substrate to be evaluated more easily.

As described above, the surface of the silicon substrate is etched with the mixed solution which contains ammonia, hydrogen peroxide and water. The silicon substrate is evaluated based on the density of the pits which have occurred in the surface. This enables any inappropriate silicon substrates, which are not proper as those for use in semiconductor devices, to be discriminated from the appropriate substrates in order to prevent a lowering of the manufacturing yield of the semiconductor devices.

BRIEF DESCRIPTION OF THE DRAWINGS

FIG. 1A is a graph which shows the result of three types of to-be-evaluated substrates being evaluated by a conventional silicon substrate evaluation method, while

FIG. 2A is a graph showing the first comparative example, while FIG. 2B is a graph which shows the result of the to-be-evaluated substrates being evaluated by a method according to the first embodiment of the present invention;

FIG. 3 is a graph which shows the result of the to-be-evaluated substrates being evaluated by a method according to another comparative example in which an etchant mixing ratio has been varied.

DETAILED DESCRIPTION OF THE PREFERRED EMBODIMENTS

The result of the silicon substrate evaluation, conducted by employing a conventional evaluation method, will be now described before explaining embodiments of the present invention. First of all, three types of to-be-evaluated substrates, i.e., appropriate substrates, inappropriate substrates and copper-contaminated substrates, were prepared. The appropriate substrates were prepared by polishing, with the appropriate pressure, the silicon substrates having (100) faces and manufactured by the Czochralski method. The inappropriate substrates were prepared by polishing such silicon substrates with a pressure different from the appropriate pressure. The copper-contaminated substrates were prepare by spraying a surface active agent, having a Cu concentration of approximately 100 ppb, over the surfaces of such appropriate substrates and thereafter subjecting those substrates to a final cleaning process. The Cu concentration at the surfaces of the copper-contaminated substrates was $1\times10^8$ cm$^{-2}$ or less.

Figure 1A:
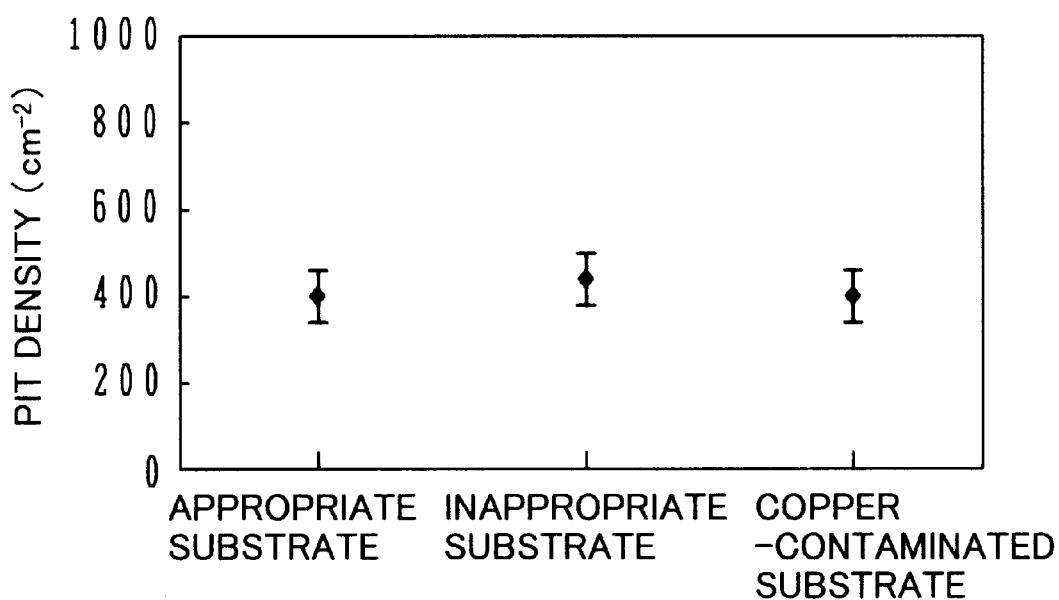

FIG. 1A is a graph showing the density of the pits which have occurred in the substrate surfaces after the three types of to-be-evaluated substrates were etched by using the acid selective etchant. In the graph of FIG. 1A, values of the pit density which are expressed in a unit of cm$^{-2}$ are allotted on the axis of ordinates. The values of the pit density were measured through utilization of a differential interference microscope. The secco etching method which employs HF and $K_2Cr_2O_7$ and the SirtI etching method which employs HF and $CrO_3$ are known as the etching methods adopting the acid selective etchant.

The pit density in the case of the use of the appropriate substrates, that in the case of the use of the inappropriate substrates, and that in the case of the use of the copper-contaminated substrates were approx. 400 cm$^{-2}$, 440 cm$^{-2}$ and 415 cm$^{-2}$, respectively. Thus, there were not considerable differences in pit density.

Figure 1B:
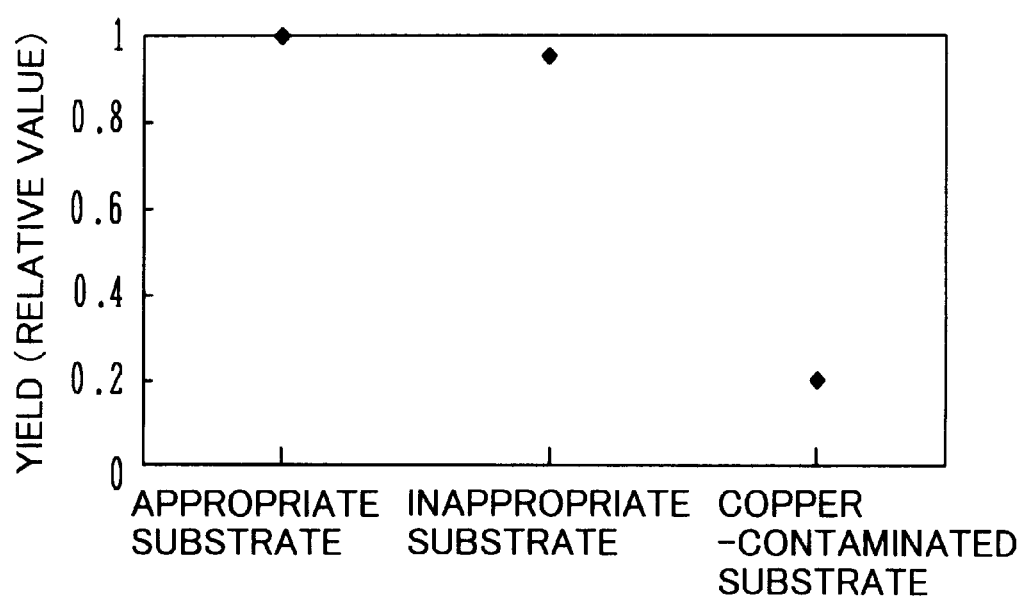
FIG. 1B is a graph which shows the yield of DRAMs manufactured using the three types of to-be-evaluated substrates.

FIG. 1B is a graph showing the yield of DRAMs whose wires are at least 0.4 μm wide and which have been manufactured using the aforementioned three types of to-be-evaluated substrates. In the graph of FIG. 1B, relative yields with respect to the yield in the case of the use of the appropriate substrates are allotted on the axis of ordinates. The relative yield in the case of the use of the inappropriate substrates and that in the case of the use of the copper-contaminated substrates were 0.95 and 0.2, respectively. Thus, when the inappropriate substrates were employed, the yield was slightly lower than that in the case of the use of the appropriate substrates, and particularly when the copper-contaminated substrates were employed, the yield was considerably lower than that in the case of the use of the appropriate substrates.

In order to prevent a lowering of the yield, it is required to extract and remove such inappropriate substrates and copper-contaminated substrates before the DRAM manufacturing process. According to the conventional silicon substrate evaluation method carried out to obtain the graph of FIG. 1A, however, it is difficult to discriminate the inappropriate substrates and the copper-contaminated substrates from the appropriate substrates.

The first embodiment of the present invention, by which the inappropriate substrates and the copper-contaminated substrates can be discriminated from the appropriate substrates, will now be described.

The surface layer portions of the to-be-evaluated substrates were etched to a predetermined depth, for example, approx. 50 nm, by using the mixed etchant which contained ammonia, hydrogen peroxide and water. The etchant contained 29% ammonia by weight and 31% hydrogen peroxide by weight. The etchant was prepared by mixing ammonia, hydrogen peroxide and water together at a volumetric ratio of 1:2:110. The density of ammonia and that of hydrogen peroxide were 0.90 g/cm$^3$ and 1.11 g/cm$^3$, respectively, and hence the weight ratio among ammonium hydroxide ($NH_4OH$), hydrogen peroxide ($H_2O_2$) and water ($H_2O$) in the etchant was approx. 1:2.64:430. The temperature of the etchant at the time of etching was 80° C.

Pits occurred in the surfaces of the silicon substrates as a result of the etching of their surface layer portions. With a defect inspection apparatus utilizing laser beams, the number of pits was measured to obtain the density of the pits, on the condition of detecting particles having a size of 0.1 μm or larger.

FIG. 2A shows the result of the evaluation according to the first comparative example in which the etch depth was set at 10 nm, while FIG. 2B shows the result of the evaluation according to the first embodiment of the present invention in which the etch depth was set at 50 nm. The diameter of the wafers used in the first comparative example and the first embodiment was 150 mm. When the etch depth was set at 10 nm, the pit density or the number of pits was 290 per wafer in the case of the appropriate substrates, the pit density was 300 per wafer in the case of the inappropriate substrates, and the pit density was 310 per wafer in the case of the copper-contaminated substrates. Thus, there were not remarkable differences in pit density among the three types of to-be-evaluated substrates. When the etch depth was set at 50 nm, however, the pit density was approx. 1500 per wafer in the case of the appropriate substrates, the pit density was approx. $1\times10^4$ per wafer in the case of the inappropriate substrates, and the pit density was approx. $1\times10^5$ per wafer in the case of the copper-contaminated substrates.

Thus, when the etch depth was set at 50 nm, the density of the measurable pits increased rapidly, and considerable differences in pit density occurred among the three types of to-be-evaluated substrates, compared to the case where the etch depth was set at 10 nm. In conclusion, when the above-described etchant and an etch depth of 50 nm were adopted, the inappropriate substrates and the copper-contaminated substrates could be discriminated from the appropriate substrates.

If the depth of etching was shallow, the pits would also be small accordingly, in which case such considerable differences in pit density would not occur among the three types of to-be-evaluated substrates. In order to permit the inappropriate substrates and the copper-contaminated substrates to be discriminated from the appropriate substrates it is preferred that the etch depth be 30 nm or larger.

Next, the to-be-evaluated substrates were evaluated setting the etch depth at 50 nm and varying the mixing ratio of the etchant. The valuation results are shown in the following table:

| Volumetric ratio among ammonia, hydrogen peroxide and water | Evaluation results |
| --- | --- |
| 1:2:110 | ◯ |
| 1:2:70 | ◯ |
| 1:2:20 | X |
| 1:2:10 | X |
| 1:1:100 | ◯ |
| 1:1:5 | X |
| 1:5:50 | X |
| 1:5:100 | X |

The mark "◯" in the above table indicates the case where the three types of to-be-evaluated substrates could be discriminated from each other, whereas the mark "x" indicates the case where they could not be discriminated from each other.

FIG. 3 shows, of the evaluation results in Table 1, the evaluation result when the mixing ratio of the etchant was set at 1:1:5. As seen from FIG. 3, the pit density in the case of the appropriate substrates, that in the case of the inappropriate substrates and that in the case of the copper-contaminated substrates were all approx. 1500 per wafer, and therefore the inappropriate substrates and the copper-contaminated substrates could not be discriminated from the appropriate substrates.

As should be apparent from the evaluation results shown above, it is preferred that ammonium, hydrogen peroxide and water in the etchant be mixed at a volumetric ratio of 1:(1 to 2):(70 to 110). This preferred volumetric ratio can be expressed in a weight ratio of $NH_4OH:H_2O_2:H_2O=1:(1.3$ to $2.65):(275$ to $433)$. Even if a weight ratio of 1:(1.3 to 5.3):(275 or greater) was adopted as the mixing ratio of the etchant, the advantage as that mentioned previously would be attained.

The second embodiment of the present invention will now be described. The surface layer portions of the to-be-evaluated substrates were etched using the same etchant, having a mixing ratio of 1:2:110, as that of the first embodiment.

The first thermal oxidation was carried out after the etching of the surface layer portions. The conditions of the oxidation were a gaseous oxygen flow rate of 15 slm and a substrate temperature of 1000° C.

The to-be-evaluated substrates were subjected to a heat treatment after the first thermal oxidation. The conditions of the heat treatment were a nitrogen atmosphere, a gaseous nitrogen flow rate of 15 slm, a substrate temperature of 1200° C. and a heat treatment period of 3 to 12 hours.

The second thermal oxidation was carried out after the heat treatment. The conditions of the oxidation were a wet oxygen atmosphere, a gaseous hydrogen flow rate of 9 slm, a gaseous oxygen flow rate of 6 slm and a substrate temperature of 900° C.

After the above-described steps were finished, the number of pits was measured to obtain the density of the pits, by using the defect inspection apparatus adopting laser beams and on the condition of detecting extraneous articles with a size of 0.2 μm or larger at the substrate surfaces.

FIGS. 4A to 4D show the evaluation results according to the silicon substrate evaluation method of the second embodiment. The evaluation conditions under which each of the evaluation results shown in FIGS. 4A to 4D were obtained are as shown in the following table:

| FIG. | Etch Depth | Atmosphere of first thermal oxidation | Film thickness in first thermal oxidation |
|---|---|---|---|
| A | 30 nm | $O_2$ + HCl | 30 nm |
| B | 30 nm | Dry $O_2$ | 30 nm |
| C | 30 nm | $O_2$ + HCl | 50 nm |
| D | 10 nm | $O_2$ + HCl | 30 nm |

Figure 4A:
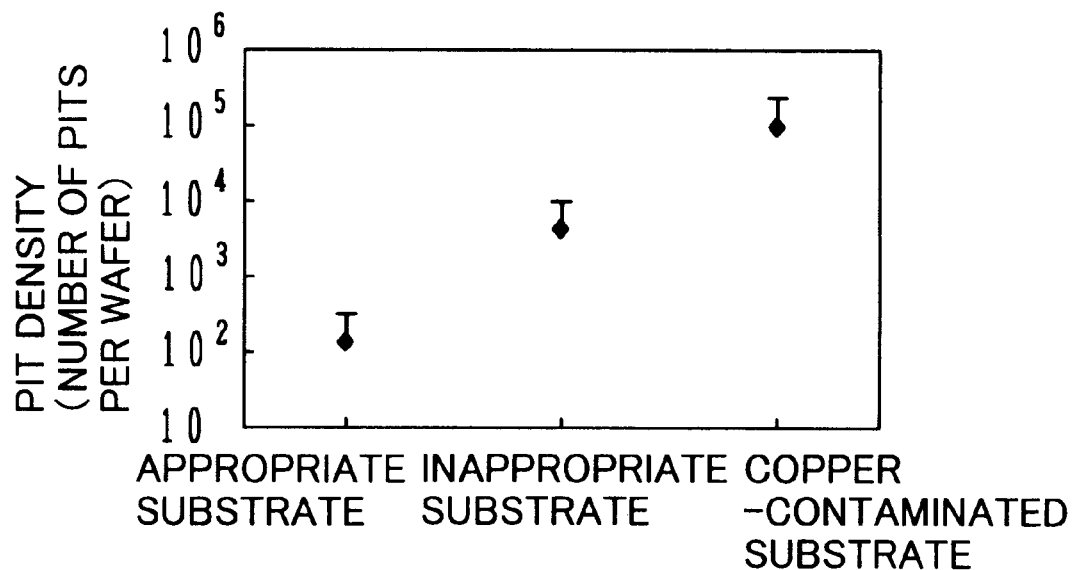
FIGS. 4A to 4D are graphs each of which shows the result of the to-be-evaluated substrates being evaluated by a method according to the second embodiment of the present invention.
Figure 4B:
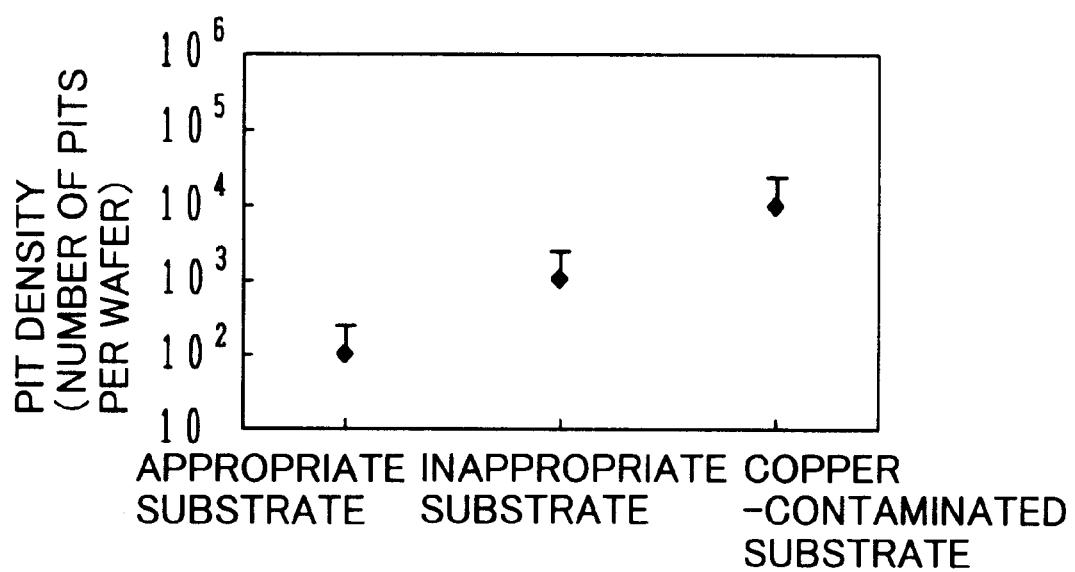

Comparing FIGS. 4A and 4B with each other, it can be understood that when the first thermal oxidation was carried out in the atmosphere containing both $O_2$ and HCl, the differences in pit density among the three types of to-be-evaluated substrates were larger than in the case of the atmosphere containing $O_2$ only. By virtue of the addition of hydrogen chloride (HCl) to the atmosphere of the first thermal oxidation, the inappropriate substrates and the copper-contaminated substrates could be discriminated more easily than in the case of the atmosphere containing $O_2$ only. In place of hydrogen chloride, hydrogen halide other than hydrogen chloride may be added to the atmosphere.

Figure 4C:
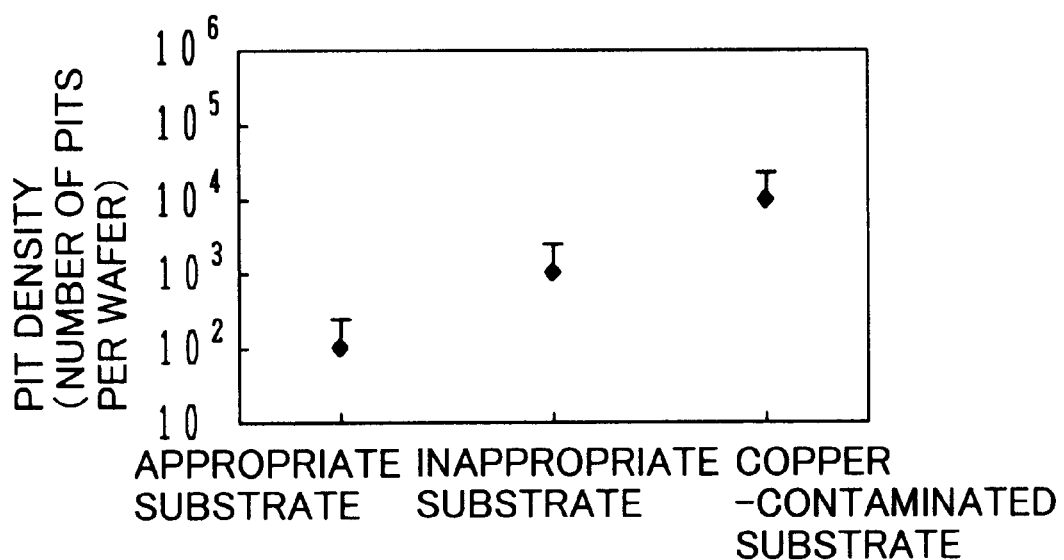

Comparing FIGS. 4A and 4C with each other, it can be understood that when the thickness of the oxide film formed through the first thermal oxidation was 30 nm, the differences in pit density among the three types of to-be-evaluated substrates were larger than in the case where the thickness of the oxide film was 50 nm. However, the effective thickness of the silicon oxide film formed through the first thermal oxidation is between at least 20 nm and 50 nm.

Figure 4D:
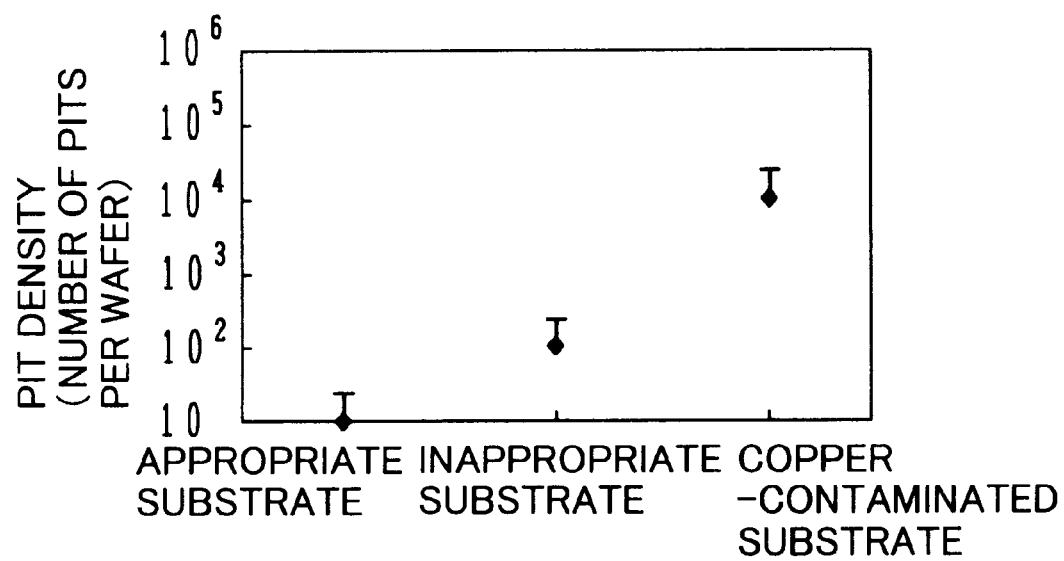

As seen from FIG. 4D, there were considerable differences in pit density among the three types of to-be-evaluated substrates also when the etch depth was set at 10 nm. According to the first comparative example explained with reference to FIG. 2A, remarkable differences in pit density were not present among the three types of to-be-evaluated substrates. According to the second embodiment, in contrast, there were considerable differences in pit density. The reason for this is deemed to be as follows:

According to the second embodiment, the first thermal oxidation, the heat treatment and the second thermal oxidation were conducted after the etching was carried out by using the mixed solution which contained ammonia, hydrogen peroxide and water. Upon the careful inspection of the surfaces of the to-be-evaluated substrates after the second thermal oxidation, it was found that grooves, having lengths of several micrometers, had been formed extending from the pits in the <110> direction of the silicon substrate surfaces. It is deemed that the detection of the pits owing to the copper contamination and the crystal defects was facilitated by virtue of the presence of the aforementioned grooves, for which reason considerable differences in pit density occurred among the three types of to-be-evaluated substrates.

In the second embodiment, the heat treatment was conducted at a temperature of 1200° C. after the first thermal oxidation. In order to have the effects of the heat treatment noticeable, the temperature of the heat treatment needs to be higher than that of the first thermal oxidation.

Explained in the above embodiments is the case where the silicon substrates having a surface of (100) plane and formed by the Czochralski method were employed. However, the same advantage as that described previously would be attained even if substrates having a surface of crystal plane other than (100) plane were employed. Further explained in the above embodiments is the case where the silicon substrates having polished surfaces were adopted. However, the same advantage as that described previously would be achieved even if hydrogen annealed substrates, epitaxially grown substrates, etc. were adopted.

An example of a semiconductor device manufacturing method, which employs the evaluation method according to one of the first and second embodiments, will now be described.

First of all, a silicon substrate lot, which consists of a plurality of silicon substrates, is prepared. One silicon substrate is extracted from the silicon substrate lot. The silicon substrate as extracted is evaluated by the evaluation method according to the first or second embodiment. When the result of the evaluation is good, semiconductor devices are manufactured using other silicon substrates included in the aforementioned silicon substrate lot. When the result of the evaluation is not good, the silicon substrates included in the aforementioned silicon substrate lot are not used. In this manner, any inappropriate silicon substrates are removed before a process for manufacturing semiconductor devices, in order to improve the yield of the semiconductor devices.

As seen from FIGS. 4A to 4D, wafers having a pit density of approx. $1 \times 10^4$ per wafer, in other words, wafers having pits of the number which is approx. 56 per $cm^2$, may be determined as being defective.

The present invention has been explained along the embodiments. However, the present invention is not limited to them. For example, various modifications, improvements and combinations are possible, as should be apparent to a person skilled in the art.

What is claimed is:

1. A method for evaluating a silicon substrate, comprising:

an etching step of etching a surface layer portion of the silicon substrate with a mixed solution which contains ammonia, hydrogen peroxide and water;

a first oxidation step of oxidizing a surface of the silicon substrate subjected to said etching step;

a heat treatment step of heating the silicon substrate oxidized by said first oxidation step to a temperature higher than an oxidation temperature in said first oxidation step;

a second oxidation step of oxidizing the surface of the silicon substrate subjected to said heat treatment step; and a measurement step of measuring a density of pits which have occurred in the surface of the silicon substrate subjected to said second oxidation step.

2. The method according to claim 1, wherein said heat treatment step is carried out in an inactive gas atmosphere.

3. The method according to claim 1, wherein a silicon oxide film, having a thickness between 20 nm and 50 nm, is formed during said first oxidation step.

4. The method according to claim 1, wherein said first oxidation step is carried out in an oxygen atmosphere which contains hydrogen halide.

5. The method according to claim 1, wherein said second oxidation step is carried out in a mixed atmosphere which contains hydrogen and oxygen.

6. A method for manufacturing semiconductor devices, comprising:

a preparation step of preparing a silicon substrate lot which comprises a plurality of silicon substrates;

an extraction step of extracting one silicon substrate from the silicon substrate lot;

an etching step of etching a surface layer portion of the extracted silicon substrate with a mixed solution which contains ammonia, hydrogen peroxide and water;

a first oxidation step of oxidizing a surface of the silicon substrate subjected to said etching step;

a heat treatment step of subjecting the silicon substrate oxidized by said first oxidation step to a heat treatment of heating the silicon substrate in an inactive gas atmosphere and to a temperature higher than an oxidation temperature in said first oxidation step;

a second oxidation step of oxidizing the surface of the silicon substrate subjected to said heat treatment step;

a measurement step of measuring a density of pits which have occurred in the surface of the silicon substrate subjected to said second oxidation step;

a determination step of determining whether the silicon substrate is excellent, based on a result of a measurement performed by said measurement step; and a manufacturing step of manufacturing semiconductor devices by using other silicon substrates included in the silicon substrate lot when it is determined in said determination step that the extracted silicon substrate is excellent.

* * * * *